United States Patent [19]

Takahashi et al.

[11] 4,315,845

[45] Feb. 16, 1982

[54] PROCESS FOR PREPARING CHEMICALLY PLATABLE THERMOSETTING POWDER COATING

[75] Inventors: Hiroshi Takahashi, Kasama; Koichi Tsuyama; Nobuo Uozu, both of Shimodate; Makoto Fujikura, Hitachi, all of Japan

[73] Assignee: Hitachi Chemical Company, Ltd., Tokyo, Japan

[21] Appl. No.: 131,625

[22] Filed: Mar. 19, 1980

[30] Foreign Application Priority Data

Mar. 22, 1979 [JP] Japan .................................. 54-33924
Aug. 2, 1979 [JP] Japan .................................. 54-99148

[51] Int. Cl.$^3$ .............................................. C08K 5/15
[52] U.S. Cl. .................................... 260/42.28; 260/3; 260/38; 260/40 R
[58] Field of Search ................. 260/37 EP, 42.28, 38, 260/40 R, 3

[56] References Cited

U.S. PATENT DOCUMENTS

4,131,590 12/1978 DeFrank ........................ 260/37 EP

FOREIGN PATENT DOCUMENTS

44-21227 9/1969 Japan.
53-128773 11/1978 Japan.

*Primary Examiner*—Lewis T. Jacobs
*Attorney, Agent, or Firm*—Armstrong, Nikaido, Marmelstein & Kubovcik

[57] ABSTRACT

A process for preparing a chemically platable thermosetting powder coating characterized by preliminarily kneading a composition comprising 3 to 50% by weight of a thermosetting resin, 5 to 60% by weight of an inorganic filler and up to 80% by weight of a rubber component comprising at least 10% by weight of a rubber having ethylenic double bonds and polar groups in the molecule, the amount of which rubber component constitutes the total amount of rubber component in the final powder coating, the rubber component content of the composition to be subjected to the preliminary kneading being at least twice the rubber component content of the final powder coating, said composition being heated at a temperature of at least the melting point of the thermosetting resin at least once during the course of the preliminary kneading, thereby to effect efficient dispersion of the components. The powder coating prepared according to the process of the present invention is substantially homogeneous due to the uniform dispersion of its components, thus providing good applicability thereof on an article, excellent levelling of a coated film of the powder coating when molten in the step of heat hardening and an improved peeling strength between the coated and heat-hardened film of the powder coating and a metal deposited thereon by chemical plating. The chemically platable thermosetting powder coating prepared according to the process of the present invention may further comprise a catalyst for chemical plating, at least 50% by weight of catalyst in the final powder coating being kneaded together with the above-mentioned composition in the step of preliminary kneading.

26 Claims, No Drawings

PROCESS FOR PREPARING CHEMICALLY PLATABLE THERMOSETTING POWDER COATING

The present invention relates to a process for preparing a chemically platable powder coating. More particularly, the present invention relates to a process for preparing a powder coating which may be suitably used especially for the production of printed circuit boards with a metal core.

Decreased cost as well as improved performance of printed circuit boards has become necessary with the advance in miniaturization and performance upgrading of electronic devices. For example, the printed circuit boards are required to be supplied at low costs and to have high dimensional stability to warping and/or twisting and such stiffness properties as to stand the weight of many heavy parts to be mounted thereon as well as such good heat conductivity as to rapidly remove heat generated in the parts to be mounted thereon. Printed circuit boards prepared from synthetic resin-laminated boards which have conventionally been used do not meet such requirements. Accordingly, there is a trend toward the use of printed circuit boards with a metal core made of iron, stainless steel, aluminum, copper or the like.

In the printed circuit boards with a metal core, the electrical insulation of the metal core is indispensable. In this respect, the so-called powder coating method is attracting attention because it is easy, according to this method, to form an insulating resin layer having a uniform thickness, a wide variety of insulating resins having requisite properties such as good heat resistance can be used in this method and the method not only saves resources but also causes no substantial environmental pollution due to the non-use of solvents.

In general, powder coatings are prepared as follows. A hardner, a filler, a pigment, a flow modifier and the like are incorporated, according to need, into a thermosetting resin such as an epoxy resin, a phenolic resin, an acrylic resin or a polyester resin, followed by melt kneading at a low temperature at which the crosslinking reaction of the resin hardly proceeds. After cooling the resulting mixture is pulverized to form a powder coating having particles of up to about 300μ in size. Methods of applying such a powder coating to an article include (A) a dipping method in which the heated article is dipped in the powder coating to effect the application, (B) an electrostatic spray coating method in which the particles of the powder coating electrostatically charged at and discharged from a spray nozzle tip to which a high voltage is applied are sprayed together with air against the article connected to ground to effect the application, (C) an electrostatic fluid bed coating method in which the article connected to ground is placed in a cloud of the electrostatically-charged floating particles of the powder coating formed by blowing high voltage source-ionized air from a perforated bottom plate of a container for powder coating to effect the application, and (D) an electrostatic vibration coating method in which the particles of the powder coating are electrostatically applied to the article connected to ground in a cloud of said particles electrostatically charged by supplying the same between a DC negative electrode and an AC electrode. After the application, the powder coating applied to the article is subjected to heat hardening during which the molten powder coating flows to form a smooth surface of a hardened film of the powder coating.

Where a printed circuit is formed by chemical plating in the production of a printed circuit board, the step for providing a layer of a rubber-based composition (adhesive varnish) on a hardened film of a conventional thermosetting resin powder coating, that is, the step for applying the adhesive varnish onto the hardened film of the conventional thermosetting resin powder coating is indispensable for improving the adhesion of the printed circuit to the hardened film of the conventional thermosetting resin powder coating because direct chemical plating on the hardened film of the conventional thermosetting resin powder coating to form a printed circuit does not provide a sufficient adhesion therebetween. Therefore, complicated and uneconomical processes have heretofore been unavoidable for the production of printed circuit boards.

As a chemically platable powder coating for avoiding such complicated and uneconomical processes, there has been proposed in Japanese Patent Application Laid-Open Specification No. 128773/1978 a thermosetting powder coating comprising 100 parts by weight of a thermosetting resin and 3 to 30 parts by weight of a rubber having ethylenic double bonds and polar groups in the molecule, said powder coating having a melt viscosity of up to $10^5$ centipoises at least once during the course of heat hardening.

In general, any powder coating composition is required to have sufficient pulverizability to provide small particles of a powder coating, uniform dispersion of the components for giving uniform electrostatic chargeability to the particles of the powder coating prepared therefrom to provide good applicability thereof, and such good melt flowability as will permit the powder coating prepared therefrom to flow easily when heated under no external pressure after application thereof onto an article such as a metal plate to provide a well-leveled smooth surface of a hardened film of the powder coating.

The chemically platable powder coating proposed in Japanese Patent Application Laid-Open Specification No. 128773/1978 involves a difficulty in providing uniform and fine dispersion of the components of the powder coating in the production of the powder coating because it comprises a rubber as one component. Further, a special pulverization method such as an ultra-low temperature pulverization method must be adopted for finely pulverizing the powder coating composition containing relatively large particles of the rubber. Where the particles of the rubber are not small in size and not uniformly dispersed in the powder coating, each particle of the powder coating cannot be uniformly electrostatically charged and will have a polarized structure upon electrostatic charging, resulting in poor applicability or little applicability in electrostatic coating methods which may be attributed to the electrostatic agglomeration of the particles of the powder coating. Further, in the case of insufficient dispersion of the particles of the rubber in the powder coating, the peel strength of a printed circuit conductor formed by chemical plating on a coated and hardened film of the powder coating is insufficient and shows great lot-to-lot variation. Accordingly, there arises a need of an excessively increased rubber content of a powder coating which content, however, leads to various demerits such as lowering of the electrical characteristics of a metal core-having printed circuit board formed by using the powder coating as well as poorer dispersion of the particles of the rubber in the powder coating and poor melt flowability of the powder coating in the step of heat hardening. The poor melt flowability does not allow a coated film of the powder coating to become smooth, and, hence, causes a printed circuit formed on the hardened film of the powder coating to be poor in precision.

Accordingly, an object of the present invention is to provide a process of preparing a chemically platable powder coating, the components of which are uniformly dispersed.

In accordance with one aspect of the present invention, there is provided a process for preparing a chemically platable thermosetting powder coating comprising an intimate mixture of components in the following proportions: 100 parts by weight of at least one thermosetting resin having a melting point of up to 150° C., 1 to 30 parts by weight of a rubber component comprising at least 10% by weight of at least one rubber having ethylenic double bonds and polar groups in the molecule and up to 200 parts by weight of at least one inorganic filler, said powder coating having a melt viscosity of up to $10^5$ centipoises at least once during the course of heat hardening, the lower limit of the amount of the inorganic filler in the powder coating corresponding to that amount of the inorganic filler used in step (1) of preliminary kneading as described below, which process comprises the steps of;

(1) preliminarily kneading a composition comprising 3 to 50% by weight of at least one thermosetting resin having a melting point of up to 150° C., 5 to 60% by weight of at least one inorganic filler and up to 80% by weight of a rubber component as defined above, the amount of which constitutes the total amount of rubber component in the final powder coating, the minimum rubber component content of the composition being at least twice the rubber component content of the final powder coating, said composition being heated at a temperature of at least the melting point of the thermosetting resin at least once during the course of the preliminary kneading, thereby to effect efficient dispersion of the components;

(2) further kneading said composition together with at least one thermosetting resin having a melting point of up to 150° C. and other components which constitute the powder coating, thereby to effect intimate mixing of the components; and (3) pulverizing the resulting kneaded mass.

In general, the method of direct chemical plating on a coated film of a thermoset powder coating comprises chemically coarsening the surface of the coated film of the thermoset powder coating, subjecting the coarsened surface to dipping treatment in an aqueous solution containing catalytic metal ions to adsorb the metal ions on the coarsened surface, and subjecting the resulting surface of the film of the thermoset powder coating in a wet state to dipping treatment in a chemical plating bath to effect deposition of a metal which provides, for example, a printed circuit. The dipping treatment in the aqueous solution containing catalytic metal ions may be carried out in such a two-stage manner that the film of the thermoset powder coating having the coarsensed surface is dipped in an aqueous hydrochloric acid solution containing $Sn^{++}$ ions to sensitize the coarsened surface and the film of the thermoset powder coating having the sensitized surface is dipped in an aqueous hydrochloric acid solution containing $Pd^{++}$ ions to activate the sensitized surface. In the case of the above-mentioned method, it is very difficult to provide, prior to the chemical plating, a plating resist of a negative pattern on the surface of the film of the thermoset powder coating on which the catalytic metal ions has been adsorbed because the surface of the film of the thermoset powder coating is in a wet state or in such a state as to retain the remaining water, which state should be kept for enabling the subsequent deposition of the metal by the chemical plating to be effected stably. Accordingly, the chemical plating has to be done all over the surface of the film of the thermoset powder coating on which the catalytic metal ions have been adsorbed (panel plating). After the chemical plating on the whole surface, a desired printed circuit is formed by forming a plating resist, electroplating the exposed surface of the layer formed by panel plating, removing the plating resist and etching away the portions of the layer formed by panel plating and not having the electroplated layer. As is apparent from the above explanation, the direct chemical plating method involves complicatedness in practicing the same. For avoiding such complicatedness, there has been an attempt to incorporate a catalyst for chemical plating into a powder coating. However, difficulties have been encountered in uniformly dispersing the catalyst in the powder coating.

Accordingly, another object of the present invention is to provide a process for preparing a chemically platable powder coating which enables a printed circuit board to be produced through a simple process and which contains a catalyst for chemical plating in a uniformly dispersed state.

In accordance with another aspect of the present invention, there is provided a process as described hereinbefore, wherein the chemically platable thermosetting powder coating further comprises 0.006 to 1.2 parts by weight, per 100 parts by weight of the thermosetting resin, of a catalyst for chemical plating and the composition to be preliminarily kneaded further comprises a catalyst for chemical plating, the amount of which is at least 50% by weight the amount of catalyst in the final powder coating. As is apparent from the explanation given hereinbefore, the use of the catalyst for chemical plating is more advantageous than the non-use thereof.

A thermosetting resin having a melting point of up to 150° C. to be used in the process of the present invention may be any of those resins commonly used in powder coatings, such as epoxy resins, phenolic resins, acrylic resins, polyester resins and mixtures thereof. Epoxy resins are especially preferred. Examples of epoxy resins include bisphenolepichlorohydrin type epoxy resins derived from diglycidyl ether of bisphenol A (p,p'-isopropylidenediphenol), novolak type epoxy resins and alicyclic epoxy resins.

As to the bisphenol-epichlorohydrin type epoxy resins, those having an epoxy equivalent of 450 to 2,100 and a melting point of 64° to 131° C. may advantageously be used. Examples of commercially available products of bisphenol-epichlorohydrin type epoxy resins are listed in the following table.

TABLE 1

| Maker | Trade name | | Epoxy equivalent | Melting point (°C.) |
|---|---|---|---|---|
| Yuka Shell Epoxy K.K. (Japan) | Epikote | 1001 | 450–500 | 64–74 |
| | Epikote | 1002 | 630 | 82 |
| | Epikote | 1004 | 900–1,000 | 96–104 |
| | Epikote | 1007 | 1,750–2,100 | 122–131 |
| Ciba-Geigy | | 6071 | 450–500 | 64–74 |

TABLE 1-continued

| Maker | Trade name | Epoxy equivalent | Melting point (°C.) |
|---|---|---|---|
| (Japan) Limited (Japan) | 6084 | 900–1,000 | 96–104 |
| | 6097 | 1,750–2,150 | 123–132 |
| Dow Chemical International Limited (Japan) | D.E.R. 661-J | 450–500 | 64–74 |
| | D.E.R. 664-J | 900–1,000 | 96–104 |
| | D.E.R. 667-J | 1,750–2,150 | 122–132 |

As to the novolak type epoxy resins, phenolic novolak type epoxy resins having an epoxy equivalent of 225 to 250 and a melting point of 68° to 95° C. and o-cresylic novolak type epoxy resin having an epoxy equivalent of 200 to 235 and a melting point of 35° to 99° C. may advantageously be used. Examples of commercially available products of novolak type epoxy resins are listed in the following table.

TABLE 2

| Maker | Trade name | Epoxy equivalent | Melting point (°C.) |
|---|---|---|---|
| Ciba-Geigy (Japan) Limited (Japan) | CIBA ECN 1280 | 230 | 80 |
| | CIBA ECN 1273 | 225 | 73 |
| | CIBA ECN 1299 | 235 | 99 |

As to the alicyclic epoxy resins, those having an epoxy equivalent of 350 to 410 and a melting point of 50° to 75° C. may advantageously be used. Examples of commercially available products of alicyclic epoxy resins are listed in the following table.

TABLE 3

| Maker | Trade name | Epoxy equivalent | Melting point (°C.) |
|---|---|---|---|
| Chisso Corporation (Japan) | Chissonox 301 | 380–410 | 65–75 |
| | Chissonox 313 | 350–400 | 50–60 |

The thermosetting resins as described above may be used either alone or in combination.

A liquid epoxy resin having a small epoxy equivalent may be used, in combination with any of the above-mentioned thermosetting resins, in such an amount that a final powder coating does not bring about blocking or caking under normal temperatures and has such powder flowability as will permit the powder of the powder coating to flow substantially freely. Examples of such a liquid epoxy resin include bisphenol-epichlorohydrin type epoxy resins having an epoxy equivalent of 180 to 445, such as Epikotes 815 and 828 (trade names of products manufactured by Yuka Shell Epoxy K.K., Japan), Araldites GY 252 and GY 260 (trade names of products manufactured by Ciba-Geigy (Japan) Limited, Japan) and D.E.R. 334 and D.E.R. 331 (trade names of products manufactured by Dow Chemical International Limited, Japan); phenolic novolak type epoxy resins having an epoxy equivalent of 172 to 182, such as D.E.R. 431 (trade name of a product manufactured by Dow Chemical International Limited, Japan); and alicyclic epoxy resins having an epoxy equivalent of 131 to 222, such as Chissonoxes 221 and 289 (trade names of products manufactured by Chisso Corporation, Japan).

As hardeners for epoxy resins, there can be mentioned, for example, dicyandiamide, diaminodiphenylmethanes, m-phenylenediamine, diaminodiphenylsulfones, 2-ethyl-4-methylimidazole, phthalic anhydride, tetrahydrophthalic anhydride, hexahydrophthalic anhydride, methyl nadic anhydride, chlorendic anhydride, trimellitic acid anhydride and pyromellitic dianhydride. They may be used either alone or in combination. Such hardeners may usually be used in an amount sufficient for hardening the epoxy resins in the step of heat hardening.

The melting point of a thermosetting resin to be used in the process of the present invention is 150° C. or less. The melting point of the thermosetting resin is desired to be 30° C. or more, preferably 35° C. or more, though no problem arises in so far as the thermosetting resin is solid under normal temperatures. The use of a thermosetting resin having a melting point exceeding 150° C. may lead to heat degradation of the rubber in the step of kneading and various difficulties in the kneading operation, such as a difficulty of heating up the composition involved in kneading to a high temperature of more than 150° C. and a difficulty of carrying out the kneading operation at such a high temperature. Further, a final powder coating containing such a high melting point thermosetting resin is liable to have a high melt viscosity which may exceed $10^5$ centipoises all through the step of heat hardening.

A final powder coating obtained according to the method of the present invention is required to have a melt viscosity of up to $10^5$ centipoises, preferably up to $10^3$ centipoises, at least once during the step of heat hardening of the powder coating applied on the surface of an article such as a metal plate because the formation of a smooth film of the powder coating on the article is of great importance especially in the production of a printed circuit board for forming on the hardened film of the powder coating a precise resist pattern enough to provide a high precision printed circuit. The melt viscosity of the final powder coating in the step of heat hardening can be adjusted to a desired level, for example, by the choice of a thermosetting resin having an appropriate molecular weight and/or an appropriate hardening rate when heated. The measurement of melt viscosity is done by using a melt viscometer ROTO-VISKO RV-2 (trade name of a product manufactured by HAAKE Company, West Germany). The viscometer is operated at a temperature elevation rate of 4.5 °C./minute with a rotor PK-II rotating at 0.1 to 10 rpm to measure the torque of fluid.

A rubber having ethylenic double donds and polar groups in the molecule that is solid under normal temperatures and constitutes, either alone or in combination with other rubber as described hereinafter, a rubber component to be used in the process of the present invention has such polar groups in the molecule as nitrile groups or carboxyl groups. Rubbers having nitrile groups as the polar groups in the molecule are especially preferred. As such rubbers, there can be mentioned acrylonitrile-butadiene rubbers, methyl methacrylate-grafted natural rubbers and the like. Examples of commercial products of acrylonitrile-butadiene rubbers are listed in the following table.

TABLE 4

| Trade name | Acrylonitrile content (% by weight) | Mooney viscosity ($ML_{1+4}$, at 100° C.) |
|---|---|---|
| Nipol 1032 | 33 | 51 |
| Nipol 1042 | 33 | 78 |
| Nipol 1041 | 41 | 83 |
| Nipol 1001 | 41 | 80 |

TABLE 4-continued

| Trade name | Acrylonitrile content (% by weight) | Mooney viscosity (ML$_{1+4}$, at 100° C.) |
|---|---|---|
| Nipol 1043 | 29 | 78 |
| Nipol DN401 | 19 | 80 |
| Hycar 1000 × 132 | 51 | 55 |

Note
Maker: Nippon Zeon Co., Ltd., Japan

The above-mentioned rubbers may be used either alone or in combination.

The rubber having ethylenic double bonds and polar groups in the molecule is desired to have at least 30% by weight, based on the total of monomer units, of conjugated double bond-containing monomer units and at least 15% by weight, based on the total of monomer units, of polar group-containing monomer units from the viewpoint of improvement in the adhesion of a printed circuit conductor formed through chemical plating to the coarsened surface of a coated and hardened film of a powder coating comprising said rubber.

At least one of other rubbers such as butadiene rubbers, styrene-butadiene rubbers, chloroprene rubbers, isoprene rubbers and natural rubber which are solid under normal temperatures may be used in combination with the rubber having ethylenic double bonds and polar groups in the molecule that is used as the essential rubber of the rubber component in the process of the present invention. The amount of such other rubber may be in the range of up to 900 parts by weight, preferably 30 to 250 parts by weight, per 100 parts by weight of the rubber having ethylenic double bonds and polar groups in the molecule. Thus, the rubber component to be used in the process of the present invention comprises at least 10% by weight of at least one rubber having ethylenic double bonds and polar groups in the molecule.

Since the rubber component to be used in the process of the present invention contains a rubber having polar groups in the molecule, it is easy to intimately mix the rubber component with the thermosetting resin. From the viewpoint of efficiency of intimate mixing of the rubber with the thermosetting resin, the rubber to be used in the process of the present invention is desired to have a Mooney viscosity of up to 90 ML$_{1+4}$ as measured at 100° C. in accordance with ASTM D1646-63. Even rubbers having a Mooney viscosity exceeding 90 ML$_{1+4}$ may be used if only the Mooney viscosities thereof are reduced to 90 ML$_{1+4}$ or less, for example, by roll mastication of the rubbers or by addition of solvents to the rubbers that may provide solutions.

A liquid rubber may be additionally used in such an amount that a final powder coating does not bring about blocking or caking under normal temperatures and has such powder flowability as will permit the powder of the powder coating to flow substantially freely.

An inorganic filler to be used in the process of the present invention, there can be mentioned zirconium silicate, aluminum silicate, calcium carbonate, silicon dioxide, zinc oxide, magnesium oxide, titanium dioxide and the like. They may be used either alone or in combination. The combined use of two or more kinds of fillers which differ in solubility in an acid and/or an alkali may be effective for providing a complex structure having a rough or coarse surface of a coated and hardened film of the resulting powder coating. The filler has an auxiliary role of importance in chemically coarsening the surface of a film of a powder coating because the filler may be dissolved away together with the rubber during the step of chemical surface coarsening.

As a catalyst for chemical plating that may be used in the process of the present invention, there can be mentioned, for example, metals belonging to Groups VIII and IB of Periodic Table, such as nickel, gold, silver, platinum, palladium, rhodium, copper and iridium; and oxides, chlorides, nitrates and sulfates of the above-mentioned metals. They may be used either alone or in combination. Especially useful are palladium, gold, platinum, copper, palladium chloride, gold chloride, platinum chloride, copper oxide and their combinations with stannous chloride.

The characteristic feature of the present invention resides in that relatively large amounts of a rubber and, if desired, a catalyst for chemical plating are subjected, together with an inorganic filler and part of that amount of a thermosetting resin which is used in the recipe of a final powder coating wherein the thermosetting resin is a main component, to preliminary forced kneading, during the course of which the entire system is heated up at least once to a temperature of at least the melting point of the thermosetting resin to melt and liquefy the same, whereby efficient mutual dispersion of the thermosetting resin, the rubber, the filler and, if present, the catalyst for chemical plating can be easily conducted to obtain a dispersion with a high rubber content and a high catalyst content. In the case where the rubber content of a dispersion obtained by the preliminary forced kneading is relatively high, it is believed that the thermosetting resin, the inorganic filler and, if present, the catalyst for chemical plating are uniformly dispersed in the rubber phase.

In the preliminary kneading, the molten thermosetting resin functions not only as a lubricant for appropriately controlling the shearing force given between the rubber and the inorganic filler but also as something like a solvent in a microscopic aspect thereby to give a uniform dispersion of fine particles.

When the thermosetting resin content of the composition involved in the step of preliminary kneading is in the range of more than 50% by weight where the composition is a thermosetting resin-rich composition, the particles of the rubber can move too freely in the phase of the molten thermosetting resin to receive a sufficient shearing force, thus resulting in poor dispersion efficiency. On the other hand, when the thermosetting resin content of the composition is less than 3% by weight, the lubricating effect of the thermosetting resin is insufficient. Therefore, the thermosetting resin content of the composition involved in the step of preliminary kneading is required to be in the range of from 3% by weight to 50% by weight.

The inorganic filler content of the composition to be subjected to preliminary kneading in the process of the present invention is in the range of from 5 to 60% by weight. When the inorganic filler content of the composition exceeds 60% by weight, the lubricant- and solvent-like effect of the thermosetting resin is adversely affected. When the inorganic filler content is below 5% by weight, the shearing effect of the filler against the rubber is insufficient.

The rubber component content of the composition to be subjected to preliminary kneading is at most 80% by weight and at least twice as much as the rubber component content of a final powder coating. The rubber component content of the composition is preferably at least 15% by weight. It is more preferred that the rubber component content of the composition be 15 to 65% by weight. Since an increase in the rubber component content of the composition to be subjected to preliminary kneading results in the corresponding reduction of the inorganic filler content and/or the thermosetting resin content, too high a rubber component content of the composition leads to a poor dispersion efficiency. Too low a rubber component content of the composition also leads to a poor dispersion efficiency and inferior properties of a final powder coating.

Where a catalyst for chemical plating is to be included in a powder coating, at least 50% of the amount of the catalyst to be incorporated into the final powder coating is preliminarily kneaded together with the thermosetting resin, the rubber and the inorganic filler for achieving uniform dispersion of the catalyst in the powder coating.

The kinds of components such as thermosetting resin, inorganic filler and, if desired, catalyst for chemical plating which are to be subjected to the preliminary kneading of the step (1) may be either the same as or different from, except for the kind of rubber, those to be additionally used in the kneading of the step (2). It is, however, noted that a inorganic filler and a catalyst for chemical plating may not always be additionally used in the kneading of the step (2).

For effecting sufficient dispersion mixing of the catalyst with the rubber, the inorganic filler and the thermosetting resin in a short time, the catalyst for chemical plating may advantageously be preliminarily dispersed either in a solution of the thermosetting resin in an organic solvent or together with a carrier for the catalyst (alumina, silica, clay or the like) in an aqueous solution of hydrochloric acid. In the former case, the solution of the thermosetting resin is desired to have a viscosity of up to $10^3$ poises as measured at 23° C. for effecting the preliminary dispersion efficiently. The catalyst dispersed in the solution of the thermosetting resin may be used either as such or after partial removal of the solvent for kneading with the rubber, the inorganic filler and the thermosetting resin. In the latter case of the catalyst and the carrier dispersed in the aqueous solution of hydrochloric acid, they are subjected to, after removal of the aqueous solution of hydrochloric acid, to kneading with the rubber, the inorganic filler and the thermosetting resin.

As an apparatus used for preliminarily kneading a rubber, a thermosetting resin, an inorganic filler and, if desired, a catalyst for chemical plating to obtain a dispersion with a high rubber content and a high catalyst content, there can be mentioned kneading machines commonly used in the production of powder coatings, such as a pressure type kneader (pressurized type), a kneader, a mixing roll mill including at least two rolls and an extruder.

In the case of a pressure type kneader, a kneader or a mixing roll mill, the preliminary kneading period of time is desired to be 5 minutes or more, preferably 20 minutes to 40 minutes. After uniform dispersion of the components is attained, further kneading is unnecessary. Kneading over two hours is needed in few cases. The kneader and the pressure type kneader wherein the pressure is usually 1.2 to 5 atm are usually operated with its rotating blades rotating at 10 to 50 rpm. The mixing roll mill is usually operated with its rolls having a clearance therebetween of 3 to 20 mm and rotating at 5 to 50 rpm. In the case of an extruder, the residence time of the composition being preliminarily kneaded is desired to be 30 seconds to 5 minutes. The extruder is usually operated with its screws rotating at 30 to 100 rpm.

At least once during the course of preliminary kneading, the composition involved is heated up to a temperature of at least the melting point of the thermosetting resin, preferably a temperature ranging from the melting point of the thermosetting resin to 200° C., more preferably a temperature ranging from the melting point of the thermosetting resin to the temperature 30° C. higher than the melting point of the thermosetting resin, most preferably a temperature 1° to 10° C. higher than the melting point of the thermosetting resin. Where two or more kinds of thermosetting resins are used, the "melting point" as described above is intended to indicate the melting point of the mixture of the thermosetting resins. The period of time when the composition is heated at or above the melting point of the thermosetting resin is preferably at least 3 minutes, more preferably 3 to 35 minutes, most preferably 10 to 20 minutes, in the case of a pressure type kneader, a kneader or a mixing roll mill and 30 seconds to 5 minutes in the case of an extruder. During the other time than the time when the composition is heated at a temperature of at least the melting point of the thermosetting resin, the composition may have only to be kept at or above the lowest temperature required for enabling the kneading of the composition. For example, where the preliminary kneading is carried out by using a pressure type kneader, it is possible that all the components of the composition are put into the kneader heated at a temperature, for example, 1° to 10° C. higher than the melting point of the thermosetting resin, at which temperature the composition is then kneaded for 15 minutes, followed by the stoppage of the heating of the kneader after which the kneading is continued for an additional 15 minutes.

Due to uniform and fine dispersion of the components, especially the rubber component, of the composition attained by such preliminary kneading, the peeling strength between a coated and hardened film of a final powder coating and a metal deposited thereon by chemical plating which constitutes, for example, a printed circuit is usually improved to a level of 1.55 Kg/cm or more as measured in accordance with JIS C-6481.

A dispersion with a high rubber content and, if a catalyst is present, a high catalyst content which has been obtained by preliminary kneading is again subjected to kneading after addition thereto of a thermosetting resin and, according to need, an inorganic filler, a catalyst for chemical plating, a hardener, a vulcanizing agent, a flow modifier, a pigment and the like which are required of a final powder coating. This kneading may be done in substantially the same manner as in the above-mentioned preliminary kneading, but the kneading period of time at this step may be shortened to half to less than the time period required during the step of preliminary kneading and, if the hardener is added, the kneading temperature is so controlled that the crosslinking reaction of the thermosetting resin does not substantially proceeds. The kneading at this step may be done either in a two-stage manner as in Examples 1, 2, 3 and 5 (which will be given later) or in a one-stage manner as in Example 4 (which will be given later). As described above, the rubber-rich dispersion, if a catalyst is present, with a high catalyst content is mixed as the rubber-containing component with the other components of the final powder coating, whereby uniform dispersion of the rubber and, if present, the catalyst in the final powder coating can be easily achieved.

A rubber having ethylenic double bonds is subject to an oxidation reaction due to the unsaturation attributed to the ethylenic double bonds. When the rubber in the coated and hardened film of the powder coating obtained by the process of the present invention is attacked by an oxidizing acid to dissolve away partially the rubber in the step of pretreatment for chemical plating, the chemical coarsening of the surface of the hardened film of the powder coating is promoted by uniform dispersion of the rubber particles present in the powder coating. Further, where a catalyst for chemical plating is included in the powder coating obtained by the process of the present invention, the catalyst is well exposed on the surface of the hardened film of the powder coating by the treatment for surface coarsening, thus enabling the subsequent deposition of a metal by chemical plating to be done very excellently and efficiently.

Sufficient adhesion between the deposited metal and the film of the powder coating is attained by the polarity of the polar groups of a rubber having ethylenic double bonds and polar groups in the molecule to be used as the essential rubber of the rubber component in the process of the present invention.

The pulverization of the kneaded mass for obtaining a powder coating is done by using a pulverizing machine, examples of which include Hosokawa Bantam Mikropulverizer and Hosokawa Mikropulverizer ACM-10 (trade names of products manufactured by Hosokawa Iron Works Co., Japan) which may be used either alone or in combination with a granulating machine such as Horai's Patented Granulator (manufactured by Horai Iron Works Co., Ltd., Japan) which is used prior to fine pulverization for granulation of the kneaded mass. The pulverization is desired to be effected to such an extent that substantially all of the particles obtained are of up to 300μ in size.

The amount of the rubber component in the final powder coating is 1 to 30 parts by weight per 100 parts by weight of the thermosetting resin as the main component. Where the amount of the rubber component is less than 1 part by weight per 100 parts by weight of the thermosetting resin, there cannot be obtained, by chemical surface coarsening, such a coarsened surface of a coated and hardened film of the powder coating as will provide a good adhesion thereof to a metal (which may constitute a printed circuit) to be subsequently deposited thereon by chemical plating. Where the amount of the rubber component is more than 30 parts by weight per 100 parts by weight of the thermosetting resin, in addition to difficulties encountered in the pulverization step, a coated film of the powder coating is liable, when heat hardened, to be very poor in smoothness of its surface and to be inferior in various properties such as heat resistance and electrical insulation which are required to be good especially in the case where it is used in a printed circuit board. It is usually preferred that the amount of the rubber having ethylenic double bonds and polar groups in the molecule in the powder coating be 1.5 to 15 parts per 100 parts by weight of the thermosetting resin.

The amount of the inorganic filler in the final powder coating is up to 200 parts by weight, preferably up to 100 parts by weight, most preferably 5 to 30 parts by weight, per 100 parts by weight of the thermosetting resin. The lower limit of the amount of the inorganic filler in the final powder coating corresponds to that amount of the inorganic filler used in the step (1) of preliminary kneading.

Where the powder coating produced by the process of the present invention comprises a catalyst for chemical plating, the amount of the catalyst is 0.006 to 1.2 parts by weight, preferably 0.02 to 0.6 part by weight, per 100 parts by weight of the thermosetting resin for depositing securely and evenly a metal on a coated and hardened film of the powder coating by chemical plating. When the amount of the catalyst in the final powder coating is less than 0.006 part by weight per 100 parts by weight of the thermosetting resin, the reliability of depositing securely the metal on the film of the powder coating is liable to be low. When the amount of the catalyst in the final powder coating exceeds 1.2 parts by weight per 100 parts by weight of the thermosetting resin, increases in costs of the final powder coating and a printed circuit board produced therefrom owing to an increase in the amount of the high-priced catalyst become negligible no more.

Where the powder coating is required to have a high heat resistance and/or include a liquid rubber, a vulcanizing agent such as sulfur (0.5 to 5% by weight based on the rubber), a sulfur compound (0.5 to 5% by weight based on the rubber) or an oil-soluble phenolic resin (100 to 200% by weight based on the rubber) may be incorporated as an auxiliary material into the powder coating. Specific examples of such a sulfur compound include Nocceler-C (trade name of N,N'-diphenylthiourea manufactured and sold by Ouchi-Shinko Chemical Industrial Co., Ltd., Japan), Nocceler-EUR (trade name of N,N'-diethylthiourea manufactured and sold by Ouchi-Shinko Chemical Industrial Co., Ltd., Japan) and Nocceler-M (trade name of 2-mercaptobenzothiazole manufactured and sold by Ouchi-Shinko Chemical Industrial Co., Ltd., Japan). Specific examples of such an oil-soluble phenolic resin include Hitanol-2400 (trade name of an oil-soluble phenolic resin manufactured and sold by Hitachi Chemical Company Ltd., Japan).

The powder coating is prepared according to the process of the present invention is desired to contain, in its recipe, at least 70% of the essential components, namely the thermosetting resin, the rubber components and the inorganic filler.

The particle deposition on an article such as a metal plate of the powder coating prepared according to the process of the present invention is usually carried out according to the electrostatic fluid bed coating method (C) or the electrostatic vibration method (D) as described hereinbefore. In the method (C), the voltage of the high voltage source for the ionization of air is usually −40 to −90 kilovolts and the article is placed in the cloud of the electrostatically-charged floating particles of the powder coating for about 5 to about 30 seconds. In the method (D), the DC negative electrode has a voltage of −50 to −90 kilovolts and the article is placed in the cloud of the electrostatically charged particles of the powder coating for about 5 to 30 seconds to effect application of the powder coating onto the article. Examples of equipment for practicing the method (D) is Brennenstuhl Powder Coating Equipment Models DPE-810 and DPE-820 (manufactured by BRENNENSTUHL Company, West Germany).

Hardening of the coated film of the powder coating prepared according to the process of the present invention may be carried out at 160° to 230° C. for 15 to 120 minutes. A heat source for effecting the hardening may be heated air or far infrared rays.

The formation of a printed circuit chemically plated on a coated and hardened film of a powder coating containing no catalyst for chemical plating which has been prepared according to the process of the present invention is carried out, for example, as follows.

(1) Chemical coarsening

A base board having thereon a coated and hardened film of the powder coating is dipped in an aqueous solution of $K_2Cr_2O_7$-$H_2SO_4$ or $Na_2Cr_2O_7$-$HBF_4$-$H_2SO_4$ at 20° to 45° C. for 5 to 30 minutes to chemically coarsen the surface of the hardened film of the powder coating.

(2) Sensitizing

The base board is dipped in an aqueous solution of $SnCl_2$-HCl at room temperature for 1 to 10 minutes to sensitize the coarsened surface of the film of the powder coating.

(3) Activating

The base board is dipped in an aqueous solution of $PdCl_2$-HCl at room temperature for 1 to 10 minutes to activate the sensitized surface of the film of the powder coating.

(4) Chemical plating

The base board is dipped in a chemical plating bath containing copper sulfate, EDTA, sodium cyanide, sodium hydroxide and formalin at 15° to 65° C. for 15 to 120 minutes to effect chemical plating and form a copper layer of 0.5 to 3$\mu$ in thickness on the activated surface of the film of the powder coating.

(5) Resist application

A resist is applied onto the plated base board on the portions where a printed circuit is not to be formed to form a negative pattern of the resist.

(6) Electroplating of copper

The resist-applied base board is subjected to electroplating in a plating bath containing copper pyrophosphate or copper sulfate to form an electro-deposit of 20 to 70$\mu$ in thickness on the portions where it is not covered with the resist.

(7) Removal of resist

The resist is removed from the electroplated base board.

(8) Etching

Etching is carried out all over the surface of the resulting base board to remove the portions of the copper layer formed by chemical plating other than those portions of the copper layer which will constitute a printed circuit.

A uniform but complex geometric structure having a rough or coarse surface is easily formed, by the chemical surface coarsening treatment, on the coated and hardened film of the powder coating prepared by the process of the present invention which film may be provided on a metal plate. The adsorption of catalytic species such as $Sn^{++}$ and $Pd^{++}$ in the step of sensitizing and activating treatment is promoted by the uniform but complex geometric structure of the coarsened surface of the film of the powder coating which structure also serves together with the chemical properties in the surface of the powder coating to provide a good adhesion between the film of the powder coating and a metal deposited by chemical plating.

If the coated and hardened film of the powder coating is immersed in an organic solvent before the chemical surface coarsening to swell the surface portion of the hardened film, the chemical surface coarsening can be more easily done because the dissolution of even the unsaturated rubber particles surrounded by the crosslinked thermoset resin may proceed more smoothly. As examples of the organic solvent for swelling the surface portion of the hardened film of the powder coating, there can be mentioned mixed solvents of an alcohol such as methanol, ethanol, isopropanol or butanol with methyl ethyl ketone, pyridine, dimethylformamide or trichloroethylene.

The formation of a printed circuit chemically plated on a coated and hardened film of a powder coating containing a catalyst for chemical plating which has been prepared according to the process of the present invention is carried out, for example, as follows.

(1) Resist application

A resist is applied onto a base board having thereon a coated and hardened film of the powder coating on the portions where a printed circuit is not to be formed to form a negative pattern of the resist.

(2) Chemical coarsening

The resist-applied base board is dipped in an aqueous solution of $K_2Cr_2O_7$-$H_2SO_4$ or $Na_2Cr_2O_7$-$HBF_4$-$H_2SO_4$ at 20° to 45° C. for 5 to 30 minutes to coarsen the surface of the film of the powder coating at the portions where it is not covered with the resist.

(3) Chemical plating

The base board subjected to the chemical coarsening is dipped in a chemical plating bath at 60° to 75° C. for 30 to 60 hours to effect chemical plating and form a printed circuit having a layer thickness of 30 to 70$\mu$. As an example of the chemical plating bath, there can be mentioned CC-4 Chemical Plating Bath (trade name of a chemical plating bath manufactured and sold by Hitachi Chemical Company Ltd., Japan) having the following recipe.

| Composition of CC-4 Chemical Plating Bath | |
|---|---|
| $CuSO_4 \cdot 5H_2O$ | 12.5 g/liter |
| EDTA (ethylenediamine-tetraacetic acid) | 71 g/liter |
| Formalin (formaldehyde: 37% by weight) | 6 ml/liter |
| NaCN | 15 mg/liter |
| NaOH | to adjust the pH value to 12.0 |
| Water | balance |

The advantages of an embodiment of the present invention wherein no catalyst for chemical plating is used are as follows.

(a) The pulverization of the kneaded mass can be easily done.

(b) Since the resulting powder coating is substantially homogeneous due to the uniform dispersion of its components, each particle of the powder coating is substantially prevented from the formation of a polarized structure upon electrostatic charging. Therefore, the applicability of the powder coating is greatly improved due to substantial uniformity of the electrostatic chargeability of the particles of the powder coating as compared to those of the conventional powder coatings of a chemically platable type.

(c) Since the powder coating flows uniformly due to its substantial homogeneity when molten at the step of heat hardening, the leveling of a coated film of the powder coating is so excellent as will provide improved applicability of a resist composition or a resist film onto the hardened film of the powder coating or improved printability of the hardened film of the powder coating with a resist composition, thus enabling the printed circuit produced to be excellent.

(d) The uniform dispersion of the rubber in the powder coating gives an improved peeling strength between the coated film of the heat-hardened powder coating and a printed circuit conductor formed thereon.

In addition to the advantages as described above, an embodiment of the present invention wherein a catalyst for chemical plating is used gives the following advantages.

(e) The powder coating containing a catalyst for chemical plating which has been prepared according to this embodiment enables a printed circuit to be produced according to a very simple method comprising the step of forming a plating resist of a negative pattern on a coated and hardened film of the powder coating and the step of chemically plating the hardened film of the powder coating on the portions where it is not covered with the plating resist.

(f) Since the catalyst for chemical plating is uniformly dispersed in the powder coating, the electroless deposition of a metal on a coated and hardened film of the powder coating by chemical plating is very uniform, leading to an improved peeling strength between the hardened film of the powder coating and the deposited metal layer constituting a printed circuit and improved reliability of the printed circuit.

The present invention has been explained mainly in connection with the production of a printed circuit board with a metal core. However, the powder coating prepared according to the process of the present invention may also be used for the formation of a chemically platable coated and hardened film of the powder coating on an insulating base board.

The following Examples illustrate the present invention in more detail but should not be construed as limiting the scope of the present invention.

In the following Examples and Comparative Examples, percentages and parts are given on a weight basis.

EXAMPLE 1

25 Parts (62.5%) of Nipol 1032, 5 parts (12.5%) of Epikote 1004 and 10 parts (25.0%) of calcium carbonate as an inorganic filler were put into and kneaded in a pressure type kneader heated at 100°–105° C. at which the kneading was continued for 10 minutes. Thereafter, the heating of the kneader was stopped and the kneading was further continued for 15 minutes to obtain a dispersion with a rubber content of 62.5%.

Part of the dispersion was heat-pressed at 160° C. for 5 minutes by means of a heated press to form an about 1 mm-thick plate of the dispersion. The plate was dipped at 40° C. for 15 minutes in an aqueous solution composed of 15 g of $K_2Cr_2O_7$, 100 ml of concentrated $H_2SO_4$ and 50 ml of water to dissolve away parts of the rubber and the inorganic filler. The surface of the plate was visually observed through a microscope to confirm that the components of the dispersion were in the state of uniform dispersion.

21 Parts of the above-mentioned rubber-rich dispersion, 14 parts of calcium carbonate and 130 parts of Epikote 1004 were kneaded by means of a mixing roll mill, followed by solidification by cooling and granulation by means of a Horai's Patented Granulator. 160 Parts of the resulting granules, 3.1 parts of dicyandiamide, 1 part of finely divided silica and 1 part of Modaflow (trade name of a flow modifier manufactured and sold by Monsanto Company, U.S.A.) were mixed in a dry state by means of a Henschel mixer, followed by melt kneading by means of a Ko-Kneter PR-46 (trade name of a kneader manufactured by BUSS Company, West Germany). After solidification by cooling, the resulting kneaded mass was granulated by means of the Horai's Patented Granulator and finely pulverized by means of a Hosokawa Bantam Mikropulverizer, followed by sieving by means of a 60-mesh sieve of 250$\mu$ in openings, to prepare a powder coating, the yield of which was above 96%, thus substantiating that the kneaded mass had a good pulverizability.

The powder coating was applied onto a 1.2 mm-thick iron plate having through-holes by means of an electrostatic fluid bed coating apparatus (high voltage source for ionization of air: −80 kilovolts, application time: 10 seconds). The powder coating was heat-hardened at 180° C. for 60 minutes to form a hardened film of 150$\mu$ in thickness on the iron plate.

During the course of the application, a cloud of electrostatically charged particles of the powder coating formed by continuously blowing ionized air continued stable. The layer of the applied powder coating was substantially uniform in thickness all over the surfaces of the planar portions and the through-holes' inner wall portions of the iron plate. The hardened film of the powder coating was smooth and had no substantial orange peel, thus providing a good photoprintability and a good screen printability of the hardened film of the powder coating.

The iron plate having thereon the hardened film of the powder coating which was used as a base board was dipped in a mixed organic solvent of isopropanol-benzylalcohol (50:50 by volume) at room temperature for 2 minutes, followed by washing with water. The base board thus treated was dipped in a chemical surface coarsening solution which had been prepared by adding 20 g of $Na_2Cr_2O_7$ and 10 g of $H_2SO_4$ into such an amount of 48% $HBF_4$ as to provide a volume of the resulting solution of 1 liter. The dipping of the base board was carried out at 40°±1° C. for 10 minutes to coarsen the surface of the hardened film of the powder coating, followed by neutralization with a 5% solution of $NaHSO_3$ and washing with water which were repeated twice.

The base board subjected to chemical surface coarsening was dipped at room temperature for 5 minutes in an aqueous sensitizing solution containing 10 g/liter of $SnCl_2$ and 40 ml/liter of 36% HCl and dipped at room temperature for 5 minutes in an aqueous activating solution containing 2 g/liter of $PdCl_2$ and 20 ml/liter of 36% HCl.

The base board thus treated was dipped for 2 hours in a 70° C. aqueous electroless copper plating solution (CC-4 Chemical Plating Bath) to deposit a 3$\mu$-thick copper layer on the whole sensitized and activated surfaces of the film of the powder coating including the planer portions and the though-holes' inner wall portions.

Onto the thus electrolessly copper-plated based board in its portions other than those as would provide a printed circuit was attached a masking resist [RISTON Film (trade name of a photoresist film manufactured and sold by Du Pont Company, U.S.A.)] by using the photographic technique.

The base board with the masking resist attached thereonto was dipped for 45 minutes in a 55° C. aqueous electrolytic copper plating solution [copper pyrophosphate 85 g/liter; potassium pyrophosphate 310 g/liter; ammonia water containing 25% by weight of ammonia 2 ml/liter] while flowing electric current at a cathode current density of 3 A/100 cm$^2$.

The masking resist was removed using methylene chloride.

The resulting base board was dipped in a 40° C. aqueous solution of ammonium persulfate [$(NH_4)_2S_2O_8$:100 g/liter] to remove the portions of the copper layer other than those corresponding to a printed circuit to be formed.

The resulting base board was subjected to post-curing at 160° C. for 60 minutes to produce a printed circuit board. Thereafter, the measurement of peeling strength between the film of the powder coating and the printed circuit conductor formed thereon was carried out in accordance with JIS C-6481 to find a peeling strength of 1.70–1.80 Kg/cm. The chemically coarsened surface of the film of the powder coating was observed through a scanning electron microscope to find that a uniform but complex protrusion structure was formed all over the surface of the film of the powder coating. The surface of the printed circuit conductor peeled from the base board was visually observed to find that some parts of the powder coating torn from the base board were attached to the surface of the printed circuit conductor, thus substantiating a high adhesion between the film of the powder coating and the printed circuit conductor.

EXAMPLE 2

10 Parts of Nipol 1001, 20 parts of Solprene 406 (trade name of a styrene-butadiene rubber manufactured and sold by Philips Company, The Netherlands), 6 parts of Epikote 1001 and 50 parts of calcium carbonate as an inorganic filler were put into and kneaded in a pressure type kneader heated at 80° C. at which the kneading was continued for 10 minutes. Thereafter, the heating of the kneader was stopped and the kneading was further continued for 15 minutes to obtain a dispersion with a rubber content of 34.9%. 30 Parts of the dispersion and 170 parts of Epikote 1004 were kneaded in a pressure type kneader, followed by solidification by cooling and granulation by means of a Horai's Patented Granulator. To 200 parts of the resulting granules were added 4.0 parts of dicyandiamide, 1.5 parts of finely divided silica and 1 part of Modaflow, and a powder coating was prepared in substantially the same manner as in Example 1.

Using the resulting powder coating, a printed circuit board was produced in substantially the same manner as in Example 1. The printed circuit board obtained was substantially as excellent as that board obtained in Example 1, and the peeling strength between the film of the powder coating and the printed circuit conductor formed thereon was 1.65–1.75 Kg/cm.

EXAMPLE 3

1 Part of palladium chloride (first class grade chemical) and 83 parts of Epikote 1004 were added to 16 parts of dimethylformamide as an organic solvent and the mixing was effected at 70°–120° C. for 1 hour. The total amount of the resulting mixture, 250 parts of Nipol 1032, 50 parts of Epikote 1004, 80 parts of calcium carbonate and 20 parts of zirconium silicate were put into and kneaded in a pressure type kneader heated at 70°–105° C. at which the kneading was continued for 20 minutes to obtain a dispersion with a rubber content of 50% and a palladium chloride content of 0.2%.

22 Parts of the dispersion, 14 parts of calcium carbonate and 130 parts of Epikote 1004 were kneaded by means of a mixing roll mill, followed by solidifaction by cooling and granulation by means of a Horai's Patented Granulator. To 166 parts of the resulting granules were added 3.9 parts of dicyandiamide, 1 part of finely divided silica and 1 part of Modaflow, and a powder coating was prepared in substantially the same manner as in Example 1.

A base board having thereon a 150μ-thick insulating film of the powder coating was produced in substantially the same manner as in Example 1. The base board was screen-printed with a plating resist on the portions where a printed circuit is not to be formed, and dipped at 40°±1° C. for 15 minutes in the same chemical surface coarsening solution as used in Example 1 to coarsen the surface of the film of the powder coating, followed by neutralization with a 5% solution of $NaHSO_3$ and washing with water which were repeated twice.

The resulting base board was dipped in CC-4 Chemical Plating Bath to effect chemical copper plating, whereby a printed circuit conductor having a thickness of 35μ was provided on the base board. The area of the printed circuit was about 30% relatively to the total area of the base board. The copper deposition was uniform. The base board was visually observed through a microscope (60×magnification) to find that copper-nondeposited spots were present nowhere in the region of the printed circuit.

The chemically plated base board was subjected to postcuring at 160° C. for 60 minutes to produce a printed circuit board. The peeling strength between the film of the powder coating and the printed circuit conductor was measured in the same manner as in Example 1 to find a peeling strength of 1.65–1.85 Kg/cm.

EXAMPLE 4

0.3 Part of palladium chloride (first class grade chemical), 2.7 parts of stannous chloride (first class grade chemical) and 17 parts of 5% hydrochloric acid (first class grade chemical) were mixed, and added, with stirring, into a dispersion of 100 parts of aluminum silicate in 200 parts of water to effect uniform dispersion. Thereafter, the resulting mixture was subjected to drying at 120° C. to evaporate the water, whereby 103 parts of an inorganic filler containing the catalytic metals were obtained.

103 Parts of the catalytic metals-containing inorganic filler, 100 parts of Nipol DN401, 180 parts of Solprene 406, 50 parts of calcium carbonate as an inorganic filler, 15 parts of aluminum silicate as an inorganic filler and 100 parts of Epikote 1004 were put into and kneaded for 30 minutes in a pressure type kneader heated at 70°–105° C. to obtain a dispersion with a high rubber content and a high catalyst content. 54.5 Parts of the dispersion, 10 parts of calcium carbonate, 120 parts of Epikote 1004, 3.1 parts of dicyandiamide, 1 part of finely divided silica, 1 part of Modaflow and 5 parts of the above-mentioned catalytic metals-containing inorganic filler were melt-kneaded in a pressure type kneader. From the resulting kneaded mass was prepared a powder coating in substantially the same manner as in Example 1.

Using the powder coating thus prepared, a printed circuit board was prepared in substantially the same manner as in Example 3. It was confirmed that the copper deposition was uniform. The peeling strength between the film of the powder coating and the printed circuit conductor formed thereon was measured in the same manner as in Example 1 to find a peeling strength of 1.60–1.85 Kg/cm.

COMPARATIVE EXAMPLE 1

170 Parts of Epikote 1004, 2.9 parts of Nipol 1001, 6.3 parts of Solprene 406, 1.9 parts of Epikote 1001, 4.0 parts of dicyandiamide and 18.8 parts of calcium carbonate were put into and kneaded in a pressure type kneader heated at 100°–105° C. at which the kneading was continued for 10 minutes. Thereafter, the heating of the kneader was stopped and the kneading was further continued for 15 minutes. After the epoxy resins were molten, the torquemeter of the kneader indicated that no substantial load was recognizable, from which it was apparent that no substantial shearing force was given to the components of the mixture during the course of kneading. After the kneading, the kneaded mass was visually observed to find that small lumps to the rubbers were present in the kneaded mass, thus indicating poor dispersion of the components in the kneaded mass.

In substantially the same manner as in Example 1, from the kneaded mass was prepared a powder coating having a recipe very similar to that of the powder coating as prepared in Example 2. In the step of fine pulverization, the pulverizing efficiency was poor. The rough powder remaining through sieving after the fine pulverization was again finely pulverized, and such procedures of sieving and fine pulverization were repeated five times to provide a powder coating yield of only 89% or less.

The application of the powder coating onto an iron plate was tried according to the electrostatic fluid bed coating method in substantially the same manner as in Example 1, but it was difficult to effect uniform application of the powder coating because of insufficient formation of a cloud of particles of the powder coating which insufficient formation might be attributed to a polarized structure of each electrostatically charged particle of the powder coating.

Using an electrostatic spray gun, the powder coating was applied onto an iron plate. The layer of the applied powder coating was poor in levelling when heated in the same manner as in Example 1, and, therefore, the hardened film of the powder coating had an orange peel. A printed circuit board was prepared from the iron plate having thereon the electrostatically sprayed and heat-hardened film of the powder coating in substantially the same manner as in Example 1. The printed circuit board was poor in precision owing to the orange peel-like film of the powder coating. The peeling strength between the film of the powder coating and the printed circuit conductor formed thereon was measured in the same manner as in Example 1 to find a peeling strength of 1.10–1.45 Kg/cm, which showed somewhat large lot-to-lot variation.

COMPARATIVE EXAMPLE 2

A powder coating was prepared in substantially the same manner as in Example 3 except that the step of preliminary kneading for preparing a dispersion with a high rubber content and a high catalyst content was omitted and, instead, all of the components which were to constitute the final powder coating were kneaded by means of a mixing roll mill. A printed circuit board was prepared using the powder coating in substantially the same manner as in Example 3. The copper deposition by chemical plating was insufficient. The printed circuit board was visually observed through a microscope (60×magnification) to find that some copper-nondeposited spots were present in the region of the printed circuit. The peeling strength between the film of the powder coating and the printed circuit conductor was measured in the same manner as in Example 1 to find a peeling strength of 1.2–1.5 Kg/cm.

EXAMPLE 5

18 Parts of Nipol 1032, 41 parts of D.E.R. 667-J and 31 parts of calcium carbonate as an inorganic filler were put into and kneaded in a pressure type kneader heated at 135° C. at which the kneading was continued for 10 minutes. Thereafter, the heating of the kneader was stopped and the kneading was further continued for 15 minutes to obtain a dispersion with a rubber content of 20.0%. 90 Parts of the dispersion and 105 parts of D.E.R. 667-J were kneaded in a pressure type kneader, followed by solidification by cooling and granulation by means of a Horai's Patented Granulator. To 195 parts of the resulting granules were added 3.0 parts of dicyandiamide, 1.0 parts of finely divided silica and 1 part of Modaflow, and a powder coating was prepared in substantially the same manner as in Example 1.

Using the powder coating thus prepared, a printed circuit board was prepared in substantially the same manner as in Example 1. It was confirmed that the copper deposition was smooth and uniform and copper-nondeposited spots were present nowhere in the region of the circuit board. The peeling strength between the film of the powder coating and the printed circuit conductor formed thereon was measured in the same manner as in Example 1 to find a peeling strength of 1.55–1.80 Kg/cm.

COMPARATIVE EXAMPLE 3

40 Parts of the dispersion with a rubber content of 62.5% as prepared in Example 1 and 21 parts of Epikote 1004 were kneaded by means of a mixing roll mill, followed by solidification by cooling and granulation by means of a Horai's Patented Granulator. 61 Parts of the resulting granules, 0.52 part of dicyandiamide, 0.4 part of finely dividied silica and 0.4 part of Modaflow were mixed in a dry state by means of a Henschel mixer, followed by melt kneading by means of a KoKneter PR-46 to obtain a kneaded mass with a rubber content of 41%. After solidification by cooling, the resulting kneaded mass was cut into blocks of about 5 cm cube. Thereafter, it was tried to granulate the blockes by means of the Horai's Patented Granulator, but the granulation could not be conducted because the blocks assumed the molten state in the clearances of the rotating blades.

25 Parts (12%) of Nipol 1032, 146 parts (70%) of Epikote 1004 and 37 parts (18%) of calcium carbonate as an inorganic filler were put into and kneaded in a pressure type kneader in substantially the same manner as in Example 1 except the kneading period of time to obtain a dispersion with a rubber content of 12% which was substantially 1.6 times as much as the rubber content (7.7%) of the final powder coating prepared in Example 1. However, even after kneading over 30 minutes, it was observed that lumps of the rubber were in the dispersion, thus indicating that the rubber had not received a sufficient shearing force in the molten thermosetting resin. Using this dispersion, a powder coating having the same recipe as that of the powder coating prepared in Example 1 was prepared in substantially the same manner as in Example 1. The application of the powder coating onto an iron plate was tried according to the electrostatic fluid bed coating method in substantially the same manner as in Example 1, but it was difficult to effect uniform application of the powder coating because of insufficient formation of a cloud of particles of the powder coating.

What is claimed is:

1. A process for preparing a chemically platable thermosetting powder coating comprising an intimate mixture of components in the following proportions: 100 parts by weight of at least one thermosetting resin having a melting point of up to 150° C., 1 to 30 parts by weight of a rubber component comprising at least 10% by weight of at least one rubber having ethylenic double bonds and polar groups in the molecule and up to 200 parts by weight of at least one inorganic filler, said powder coating having a melt viscosity of up to $10^5$ centipoises at least once during the course of heat hardening, the lower limit of the amount of the inorganic filler in the powder coating corresponding to that amount of the inorganic filler used in step (1) of preliminary kneading as described below, which process comprises the steps of:
   (1) preliminarily kneading a composition comprising 3 to 50% by weight of at least one thermosetting resin having a melting point of up to 150° C., 5 to 60% by weight of at least one inorganic filler and up to 80% by weight of a rubber component as defined above, the amount of which constitutes the total amount of rubber component in the final powder coating, the minimum rubber component content of the composition being at least twice the rubber component content of the final powder coating, said composition being heated at a temperature of at least the melting point of the thermosetting resin at least once during the course of the preliminary kneading, thereby to effect efficient dispersion of the components;
   (2) further kneading said composition together with at least one thermosetting resin having a melting point of up to 150° C. and other components which constitute the powder coating, thereby to effect intimate mixing of the components; and
   (3) pulverizing the resulting kneaded mass.

2. A process according to claim 1, wherein said chemically platable thermosetting powder coating further comprises 0.006 to 1.2 parts by weight, per 100 parts by weight of the thermosetting resin, of a catalyst for chemical plating and wherein said composition to be preliminarily kneaded further comprises a catalyst for chemical plating, the amount of which is at least 50% by weight the amount of catalyst in the final powder coating.

3. A process according to claim 1 or 2, wherein said at least one thermosetting resin is an epoxy resin.

4. A process according to claim 3, wherein said epoxy resin is a member selected from the group consisting of bisphenolepichlorohydrin type epoxy resins, novolak type epoxy resins and alicyclic epoxy resins.

5. A process according to claim 1 or 2, wherein said at least one rubber having ethylenic double bonds and polar groups in the molecule has nitrile groups as the polar groups in the molecule.

6. A process according to claim 5, wherein said at least one rubber having ethylenic double bonds and polar groups in the molecule is an acrylonitrile-butadiene rubber.

7. A process according to claim 1 or 2, wherein said at least one rubber having ethylenic double bonds and polar groups in the molecule has at least 30% by weight, based on the total of monomer units, of conjugated double bond-containing monomer units and at least 15% by weight, based on the total of monomer units, of polar group-containing monomer units.

8. A process according to claim 1 or 2, wherein said rubber component consists of at least one rubber having ethylenic double bonds and polar groups in the molecule.

9. A process according to claim 1 or 2, wherein said rubber component consists of at least one rubber having ethylenic double bonds and polar groups in the molecule and a member selected from the group consisting of butadiene rubbers, styrene-butadiene rubbers, chloroprene rubbers, isoprene rubbers, natural rubber and combinations thereof.

10. A process according to claim 1 or 2, wherein said rubber component has a Mooney viscosity of up to 90 $ML_{1+4}$ as measured at 100° C. in accordance with ASTM D1646-63.

11. A process according to claim 2, wherein said catalyst for chemical plating is a member selected from the group consisting of metals belonging to Groups VIII and IB of Periodic Table, oxides, chlorides, nitrates and sulfates of said metal, and combinations thereof.

12. A process according to claim 11, wherein said catalyst for chemical plating is a member selected from the group consisting of palladium, gold, platinum, copper, palladium chloride, gold chloride, platinum chloride, copper oxide and their combinations with stannous chloride.

13. A process according to claim 1, wherein said composition is heated at a temperature in the range of from the melting point of the thermosetting resin to 200° C. at least once during the course of the preliminary kneading.

14. A chemically platable thermosetting powder coating produced by the process of claim 1 wherein the amount of the inorganic filler of the final powder coating is up to 100 parts by weight.

15. A chemically platable thermosetting powder coating produced by the process of claim 2 wherein the amount of the inorganic filler of the final powder coating is up to 100 parts by weight.

16. A chemically platable thermosetting powder coating produced by the process of claim 3 wherein the amount of the inorganic filler of the final powder coating is up to 100 parts by weight.

17. A chemically platable thermosetting powder coating produced by the process of claim 4 wherein the amount of the inorganic filler of the final powder coating is up to 100 parts by weight.

18. A chemically platable thermosetting powder coating produced by the process of claim 5 wherein the amount of the inorganic filler of the final powder coating is up to 100 parts by weight.

19. A chemically platable thermosetting powder coating produced by the process of claim 6 wherein the amount of the inorganic filler of the final powder coating is up to 100 parts by weight.

20. A chemically platable thermosetting powder coating produced by the process of claim 7 wherein the amount of the inorganic filler of the final powder coating is up to 100 parts by weight.

21. A chemically platable thermosetting powder coating produced by the process of claim 8 wherein the amount of the inorganic filler of the final powder coating is up to 100 parts by weight.

22. A chemically platable thermosetting powder coating produced by the process of claim 9 wherein the amount of the inorganic filler of the final powder coating is up to 100 parts by weight.

23. A chemically platable thermosetting powder coating produced by the process of claim 10 wherein the amount of the inorganic filler of the final powder coating is up to 100 parts by weight.

24. A chemically platable thermosetting powder coating produced by the process of claim 11 wherein the amount of the inorganic filler of the final powder coating is up to 100 parts by weight.

25. A chemically platable thermosetting powder coating produced by the process of claim 12 wherein the amount of the inorganic filler of the final powder coating is up to 100 parts by weight.

26. A chemically platable thermosetting powder coating produced by the process of claim 13 wherein the amount of the inorganic filler of the final powder coating is up to 100 parts by weight.

* * * * *